US012740002B2

(12) United States Patent
Mo et al.

(10) Patent No.: US 12,740,002 B2
(45) Date of Patent: Sep. 15, 2026

(54) SERVER CHASSIS AND SERVER

(71) Applicant: WISTRON CORP., New Taipei City (TW)

(72) Inventors: Hanjun Mo, New Taipei City (TW); Chih Yao Chou, New Taipei City (TW); Zhao-Ping Fu, New Taipei City (TW); Hua-Jun Liang, New Taipei City (TW); Jun-Hao Wang, New Taipei City (TW); Zhong-Hui Mao, New Taipei City (TW); Yisheng Chen, New Taipei City (TW); Xiao-Yi Cai, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 214 days.

(21) Appl. No.: 18/655,648

(22) Filed: May 6, 2024

(65) Prior Publication Data

US 2025/0267816 A1 Aug. 21, 2025

(30) Foreign Application Priority Data

Feb. 19, 2024 (CN) ........................ 202410187203.X

(51) Int. Cl.
*H05K 7/14* (2006.01)
*G06F 1/185* (2026.01)
(Continued)

(52) U.S. Cl.
CPC ........... *H05K 7/1487* (2013.01); *G06F 1/185* (2013.01); *G06F 1/186* (2013.01); *G06F 1/187* (2013.01);
(Continued)

(58) Field of Classification Search
CPC .......... G06F 1/187; G06F 1/185; G06F 1/186; H05K 7/1487; G11B 33/128
See application file for complete search history.

(56) References Cited

U.S. PATENT DOCUMENTS 9,826,658 B1 * 11/2017 Mao ........................ G06F 1/183
10,251,300 B1 * 4/2019 Mao ..................... H05K 7/1487
(Continued)

FOREIGN PATENT DOCUMENTS

TW 202025889 A 7/2020
TW M640397 U 5/2023

OTHER PUBLICATIONS

TW Office Action dated Jan. 17, 2025 in Taiwan application No. 113108341.

*Primary Examiner* — Nidhi Thaker
(74) *Attorney, Agent, or Firm* — McClure, Qualey & Rodack, LLP

(57) ABSTRACT

A server and a server chassis. The server chassis configured for an expansion assembly to be mounted thereon and including a housing and at least one mounting assembly. The housing includes a bottom plate, a first side plate and a second side plate. The first side plate and the second side plate are respectively connected to two opposite sides of the bottom plate. The first side plate has a top side facing away from the bottom plate. The at least one mounting assembly includes a fixed bracket and a mounting bracket. The fixed bracket is fixed to the first side plate. The mounting bracket is configured for the expansion assembly to be mounted thereon and movably disposed on the fixed bracket.

18 Claims, 12 Drawing Sheets

(51) Int. Cl.
*G06F 1/186* (2026.01)
*G06F 1/187* (2026.01)
*G11B 33/12* (2006.01)

(52) U.S. Cl.
CPC .......... *G11B 33/128* (2013.01); *H05K 7/1489* (2013.01)

(56) References Cited

U.S. PATENT DOCUMENTS

| | | | | |
|---|---|---|---|---|
| 10,285,300 | B1 * | 5/2019 | Mao | H05K 7/1489 |
| 10,292,284 | B1 * | 5/2019 | Mao | H05K 5/0217 |
| 10,888,025 | B2 * | 1/2021 | Wu | H05K 7/1487 |
| 10,966,344 | B2 * | 3/2021 | Chu | H05K 7/20736 |
| 11,310,932 | B2 * | 4/2022 | Chang | H05K 7/16 |
| 2009/0273901 | A1 * | 11/2009 | Jaramillo | H05K 7/1492 361/679.58 |
| 2012/0326002 | A1 * | 12/2012 | Li | G06F 1/183 248/672 |
| 2020/0146185 | A1 * | 5/2020 | Wu | H05K 7/20172 |
| 2024/0114648 | A1 * | 4/2024 | Yu | G06F 1/18 |

* cited by examiner

SERVER CHASSIS AND SERVER

CROSS-REFERENCE TO RELATED APPLICATIONS

This non-provisional application claims priority under 35 U.S.C. § 119(a) on Patent Application No(s). 202410187203.X filed in China on Feb. 19, 2024, the entire contents of which are hereby incorporated by reference.

TECHNICAL FIELD

The disclosure relates to an electronic device, more particularly to a server and a server chassis.

BACKGROUND

In a server chassis having a high height of 2U or more, a motherboard and a power distribution plate are usually disposed on positions of different heights. In order to simplify the assembling process and facilitate the cable management, a connector assembly is used to electrically connect the motherboard and the power distribution plate, where the connector assembly is electrically connected to the motherboard in a board-to-board manner.

However, due to the high height of the server chassis, during the assembly of the connector assembly and the server chassis, a side plate of the server chassis makes some components for the assembly to be hidden. Accordingly, the connector assembly is unable to be mounted to the server chassis in an accurate and fast manner.

SUMMARY

The disclosure provides a server chassis and a server that enable an expansion assembly to be mounted on a housing via a mounting assembly in an accurate and fast manner.

One embodiment of this disclosure provides a server chassis configured for an expansion assembly to be mounted thereon and including a housing and at least one mounting assembly. The housing includes a bottom plate, a first side plate and a second side plate. The first side plate and the second side plate are respectively connected to two opposite sides of the bottom plate. The first side plate has a top side facing away from the bottom plate. The at least one mounting assembly includes a fixed bracket and a mounting bracket. The fixed bracket is fixed to the first side plate. The mounting bracket is configured for the expansion assembly to be mounted thereon and movably disposed on the fixed bracket.

Another embodiment of this disclosure provides a server including a housing, a substrate assembly, an expansion assembly and at least one mounting assembly. The housing includes a bottom plate, a first side plate and a second side plate together forming an accommodation space. The first side plate and the second side plate are respectively connected to two opposite sides of the bottom plate. The first side plate has a top side. The substrate assembly is disposed in the accommodation space. The expansion assembly includes an assembling bracket and a circuit board assembly. The circuit board assembly is disposed on the assembling bracket and electrically connected to the substrate assembly. The at least one mounting assembly includes a fixed bracket and a mounting bracket. The fixed bracket is fixed to the first side plate. The mounting bracket is configured for the expansion assembly to be mounted thereon and movably disposed on the fixed bracket.

According to the server chassis and the server disclosed by above embodiments, the mounting bracket is configured for the expansion assembly to be mounted thereon and is movably disposed on the fixed bracket. Thus, the mounting bracket is enabled to be moved to, for example, a position in which it protrudes out of the top side. In this way, during the mount of the expansion assembly, the mounting bracket protruding out of the top side without being blocked by the first side plate is visible. Thus, the expansion assembly is enabled to be mounted on the housing in an accurate and fast manner.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
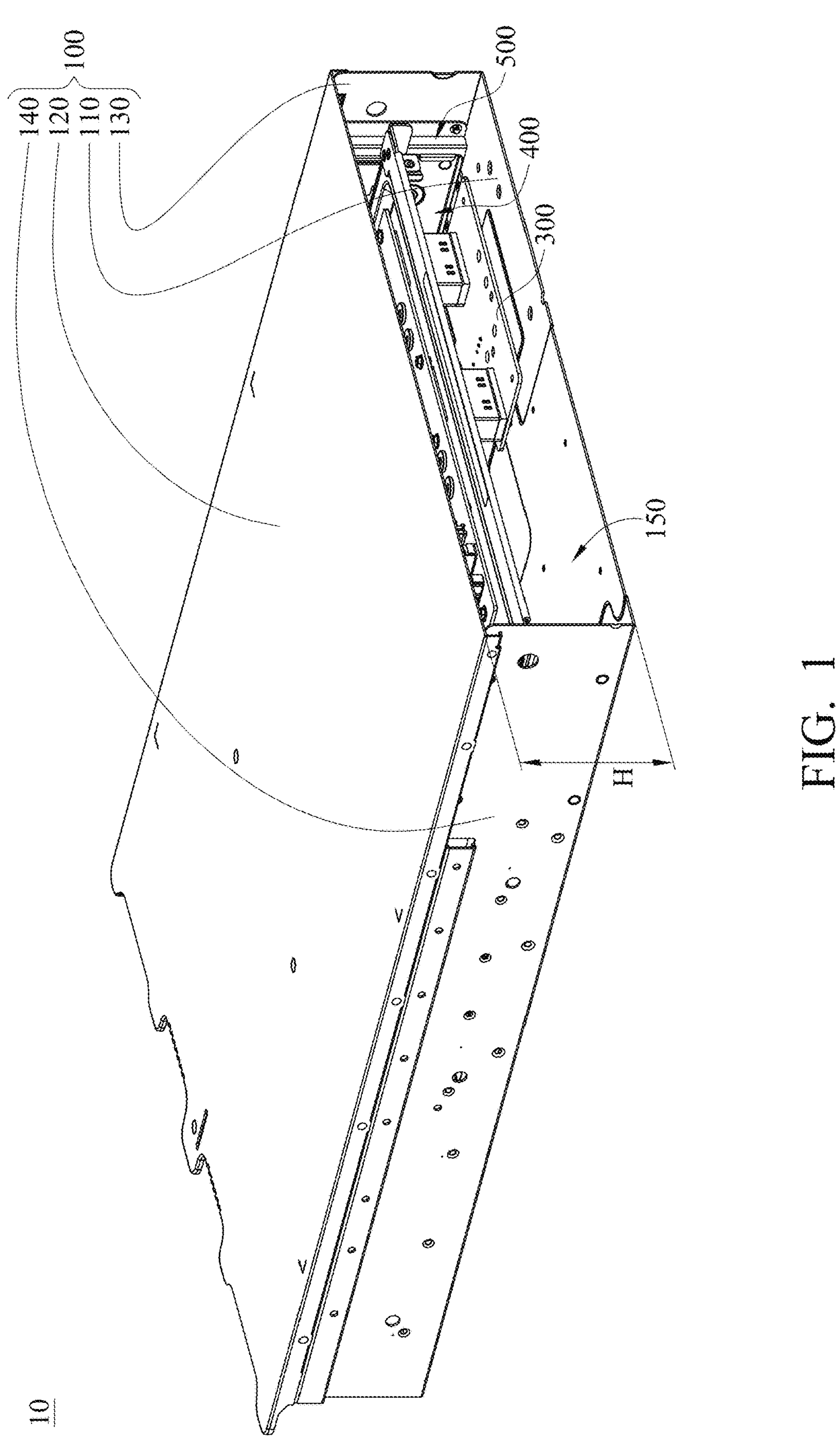
FIG. 1 is a perspective view of a server according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
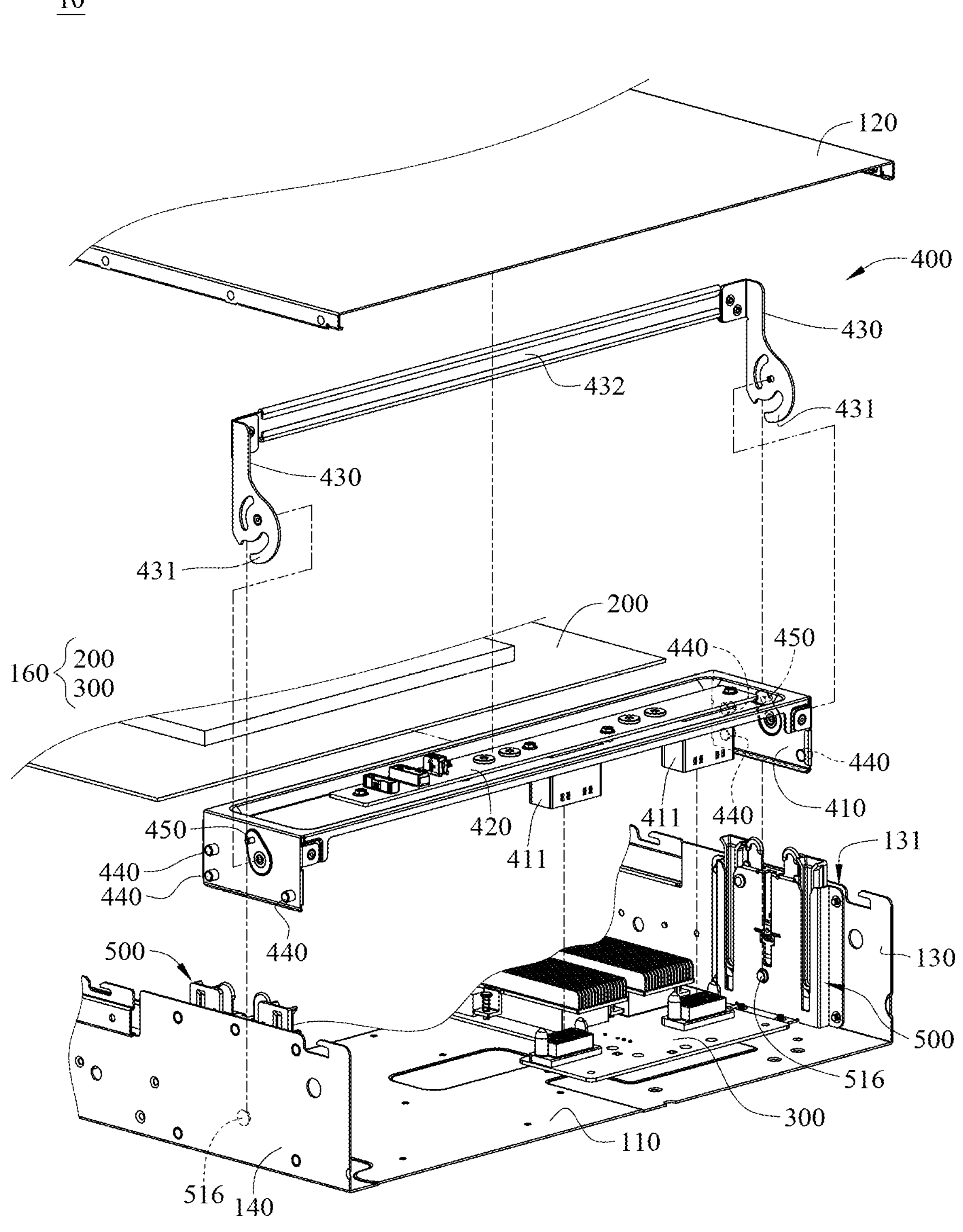
FIG. 2 is a perspective exploded view of the server in FIG. 1.
Figure 3:
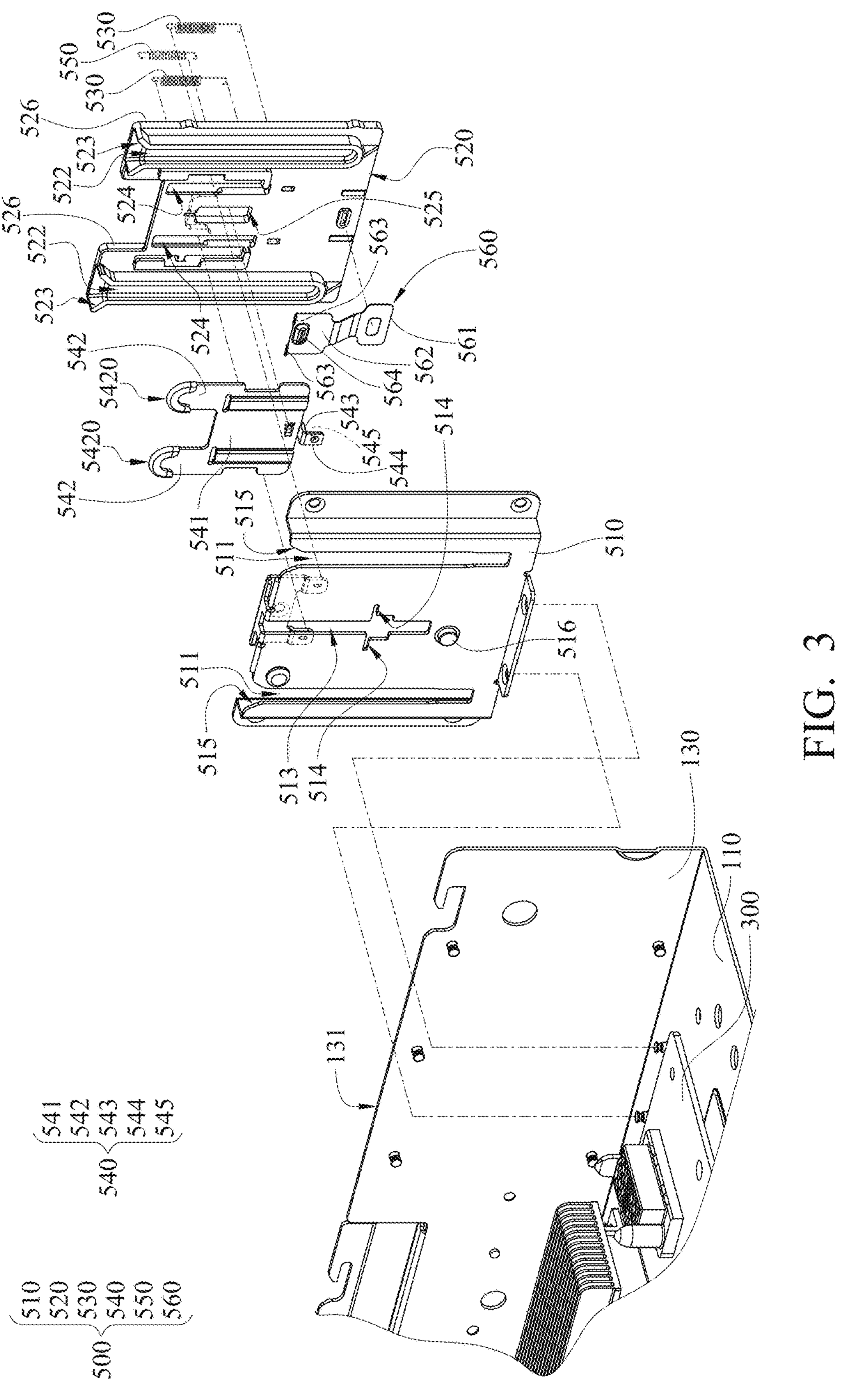
FIG. 3 is another perspective exploded view of the server in FIG. 1 that is partially enlarged with a top plate being omitted.

Please refer to FIGS. 1 to 3. FIG. 1 is a perspective view of a server 10 according to one embodiment of the disclosure. FIG. 2 is a perspective exploded view of the server 10 in FIG. 1. FIG. 3 is another perspective exploded view of the server 10 in FIG. 1 that is partially enlarged with a top plate 120 being omitted. In this embodiment, the server 10 includes a housing 100, a substrate assembly 160, an expansion assembly 400 and two mounting assemblies 500. The housing 100 and the two mounting assemblies 500 may together be referred as a server chassis.

The housing 100 includes a bottom plate 110, a top plate 120, a first side plate 130 and a second side plate 140 that together form an accommodation space 150. The first side plate 130 and the second side plate 140 are respectively connected to two opposite sides of the bottom plate 110. The first side plate 130 has a top side 131 facing away from the bottom plate 110. A height H of the housing 100 is, but not limited to, 2U or more. In this embodiment, the top plate 120 is, for example, detachably assembled to sides of the first side plate 130 and the second side plate 140 away from the bottom plate 110. Further, the top plate 120 is detachably assembled to sides of the first side plate 130 and the second side plate 140 located farthest away from the bottom plate 110. The top plate 120 has, for example, a plurality of hook portions. For example, there is a plurality of assembling holes located on sides of the first side plate 130 and the second side plate 140 away from the bottom plate 110. Further, the assembling holes are located on sides of the first side plate 130 and the second side plate 140 located farthest away from the bottom plate 110. For example, the hook portions of the top plate 120 are hooked on the first side plate 130 and the second side plate 140 in the assembling holes. In other embodiments, the top plate may not have the hook portions, there may not be assembling holes on the first side plate and the second side plate, and the top plate may be fixed to the first side plate and the second side plate by screwing.

The substrate assembly 160 includes a motherboard assembly 200 and a circuit board 300. The motherboard assembly 200 is disposed in the accommodation space 150. The circuit board 300 is, for example, a power distribution board (PDB), and is disposed in the accommodation space 150. The motherboard assembly 200 and the circuit board 300 have, for example, different heights relative to the bottom plate 110.

The expansion assembly 400 is, for example, a connector assembly, and includes an assembling bracket 410 and a circuit board assembly 420. The circuit board assembly 420 is disposed in the assembling bracket 410, and electrically connects the motherboard assembly 200 and the circuit board 300. For example, the circuit board assembly 420 is electrically connected to the motherboard assembly 200 in a board-to-board manner, and the circuit board assembly 420 is electrically connected to the circuit board 300 via one or more connectors 411.

The two mounting assemblies 500 are similar in structure. Thus, only the detailed structure of one of the two mounting assemblies 500 will be exemplary described hereinafter.

In this embodiment, the mounting assembly 500 includes a fixed bracket 510, a mounting bracket 520, two elastic components 530, a pushed bracket 540, an elastic component 550 and an elastic fastener 560.

The fixed bracket 510 is fixed to the first side plate 130. The mounting bracket 520 is slidably disposed in the fixed bracket 510. The pushed bracket 540 is slidably disposed in the mounting bracket 520. The elastic fastener 560 includes a fixed end portion 561 and a movable end portion 562 that are opposite to each other. The fixed end portion 561 is fixed to the mounting bracket 520. The movable end portion 562 is located between the fixed bracket 510 and the first side plate 130.

In this embodiment, as shown in FIGS. 2 and 3, there is a mounting pin 516 on each fixed bracket 510. The expansion assembly 400 may further include two labor-saving handles 430. The two labor-saving handles 430 are respectively pivotally connected to two opposite sides of the assembling bracket 410. The two labor-saving handles 430 are respectively configured to push the two mounting pins 516, to save the labor for mounting the expansion assembly 400 to the housing 100 or removing the expansion assembly 400 from the housing 100. In this embodiment, for example, the two labor-saving handles 430 are connected to each other via a handheld portion 432, and the two labor-saving handles 430 and the handheld portion 432 are integrally formed as a single piece, but the disclosure is not limited thereto. In other embodiments, the two labor-saving handles may be separate structures that are spaced apart from each other.

In this embodiment, as shown in FIGS. 2 and 3, the mounting bracket 520 has two first guiding structures 522, and there are two or more second guiding structures 440 on each of the two opposite sides of the assembling bracket 410 of the expansion assembly 400. For example, each first guiding structure 522 is a guiding groove and each second guiding structure 440 is a guiding pin. The second guiding structures 440 are respectively slidably disposed in the first guiding structures 522. In other embodiments, the configurations of the first guiding structures and the second guiding structures may be exchanged so that each first guiding structure may be a guiding pin and each second guiding structure may be a guiding groove. In other embodiments, there may be one first guiding structure and one second guiding structure.

In this embodiment, as shown in FIG. 3, the fixed bracket 510 has two first sliding structures 511, and the mounting bracket 520 has two second sliding structures 526. The two second sliding structures 526 are respectively and slidably disposed in the two first sliding structures 511, to enable the mounting bracket 520 to be moved toward or away from the bottom plate 110 relative to the fixed bracket 510, thereby enabling the mounting bracket 520 and the first guiding structure 522 thereof to selectively protrude out of the top side 131. In addition, the two or more second guiding structures 440 of the expansion assembly 400 may respectively slide in the two first sliding structures 511. For example, each first sliding structure 511 is a sliding groove and each second sliding structure 526 is a slider, but the disclosure is not limited thereto. In other embodiments, the configurations of the first sliding structures and the second sliding structures may be exchanged so that each first sliding structure may be a slider and each second sliding structure may be a sliding groove. Moreover, in other embodiments, there may be one first sliding structure and one second sliding structure.

In this embodiment, as shown in FIG. 3, the fixed bracket 510 may further have two first engagement structures 514, and the elastic fastener 560 may further include two second engagement structures 563. For example, each first engagement structure 514 is an engagement hole and each second engagement structure 563 is an engagement protrusion. The two second engagement structures 563 are located on the movable end portion 562. The two second engagement structures 563 are respectively and detachably engaged with the two first engagement structures 514. In other embodiments, the configurations of the first engagement structures and the second engagement structures may be exchanged so that each first engagement structure may be an engagement protrusion and each second engagement structure may be an engagement hole. In addition, in other embodiments, there may be one first engagement structure and one second engagement structure.

In this embodiment, as shown in FIG. 3, there may be a plurality of guiding surfaces 515 on a side of the fixed bracket 510 away from the bottom plate 110. Further, the guiding surfaces 515 are located on a side of the fixed bracket 510 located farthest away from the bottom plate 110. The guiding surfaces 515 are, for example, inclined surfaces or rounded surfaces, and are respectively connected to the two first sliding structures 511. There may be a plurality of guiding surfaces 523 on a side of the mounting bracket 520 away from the bottom plate 110. The guiding surfaces 523 are located on a side of the mounting bracket 520 located farthest away from the bottom plate 110. The guiding surfaces 523 are, for example, inclined surfaces or rounded surfaces, and are respectively connected to the two first guiding structures 522. Due to the guiding surfaces 515 and 523, the second guiding structure 440 is enabled to be smoothly put into the first sliding structure 511 and the first guiding structure 522. In other embodiments, the fixed bracket and the mounting bracket may not have the guiding surfaces 515 and 523.

As shown in FIG. 3, the elastic components 530 are, for example, extension springs. Two opposite ends of each elastic component 530 are respectively fixed to the fixed bracket 510 and the mounting bracket 520, so as to enable a position of the mounting bracket 520 relative to the fixed bracket 510 to be restored. The two elastic components 530 are respectively disposed in, for example, two through holes 524 of the mounting bracket 520.

In this embodiment, as shown in FIG. 3, the pushed bracket 540 is slidably disposed in, for example, two sliding grooves formed by two protrusions on the mounting bracket 520. The two protrusions on the mounting bracket 520 are located between the two first guiding structures 522. In addition, the pushed bracket 540 includes a body portion 541, two first pushed portions 542, a second pushed portion 543, a protruding portion 544 and a pushing protrusion 545. The two first pushed portions 542 protrude from a side of the body portion 541 away from the bottom plate 110, and are spaced apart from each other. Further, the two first pushed portions 542 protrude from a side of the body portion 541 located farthest away from the bottom plate 110. Each first pushed portion 542 has a guiding surface 5420 that faces away from the body portion 541 and is in a rounded shape. In other embodiments, the first pushed portions may not have the guiding surface, and the pushed bracket may include one first pushed portion.

The second pushed portion 543 protrudes from a side of the body portion 541 away from the first side plate 130. Further, the second pushed portion 543 protrudes from a side of the body portion 541 located farthest away from the first side plate 130. In this embodiment, the fixed bracket 510 further has a groove 513, and the expansion assembly 400 further includes two assembling pins 450. The groove 513 is located between the two first sliding structures 511. The two assembling pins 450 respectively protrude from two opposite sides of the assembling bracket 410. The second pushed portion 543 is located in the groove 513, and the corresponding assembling pin 450 is configured to be moved in the groove 513 and push the second pushed portion 543.

The protruding portion 544 is connected to a side of the second pushed portion 543 away from the body portion 541. Further, the protruding portion 544 is connected to a side of the second pushed portion 543 located farthest away from the body portion 541. For example, the second pushed portion 543 and the protruding portion 544 are in a plate shape and perpendicular to each other.

The pushing protrusion 545 protrudes from a side of the protruding portion 544 close to the first side plate 130. Further, the pushing protrusion 545 protrudes from a side of the protruding portion 544 located closest to the first side plate 130. In this embodiment, the elastic fastener 560 may further include a pushed protrusion 564. The pushed protrusion 564 is located on a side of the movable end portion 562 away from the first side plate 130. Further, the pushed protrusion 564 is located on a side of the movable end portion 562 located farthest away from the first side plate 130. The pushed protrusion 564 is configured to be pushed by the pushing protrusion 545 so as to enable the first engagement structure 514 and the second engagement structure 563 to be disengaged from each other.

As shown in FIG. 3, the elastic component 550 is, for example, an extension spring. Two opposite ends of the elastic component 550 are respectively fixed to the body portion 541 of the pushed bracket 540 and the mounting bracket 520, so as to enable a position of the pushed bracket 540 relative to the mounting bracket 520 to be restored. The elastic component 550 is disposed in, for example, a through hole 525 of the mounting bracket 520.

The expansion assembly 400 is respectively mounted to the first side plate 130 and the second side plate 140 via the two mounting assemblies 500 in a similar manner. Thus, the detailed process for mounting the expansion assembly 400 to the first side plate 130 via the mounting assembly 500 will be exemplary described.

Figure 4:
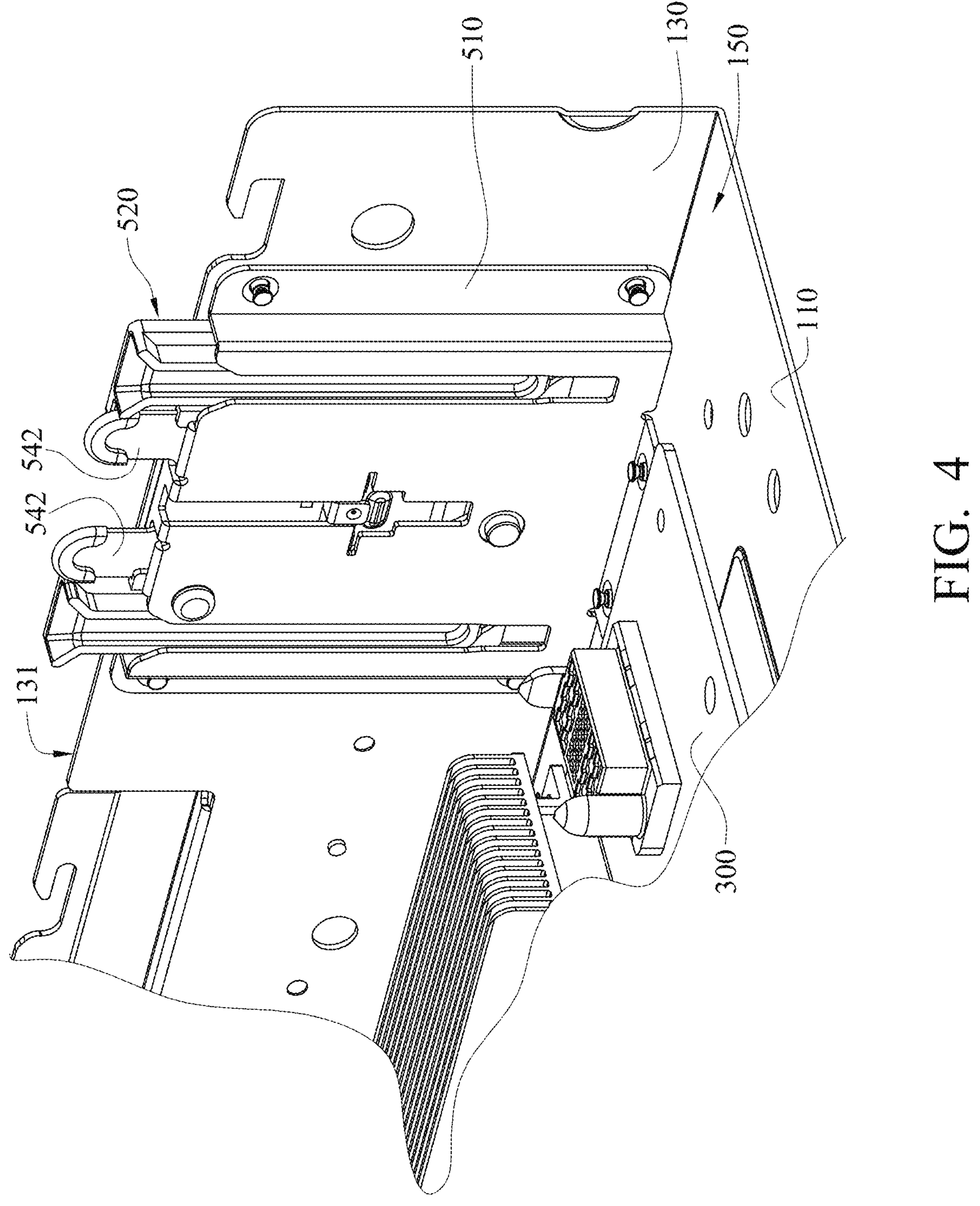
FIGS. 4-10 show a mounting process of an expansion assembly of the server in FIG. 1.
Figure 5:
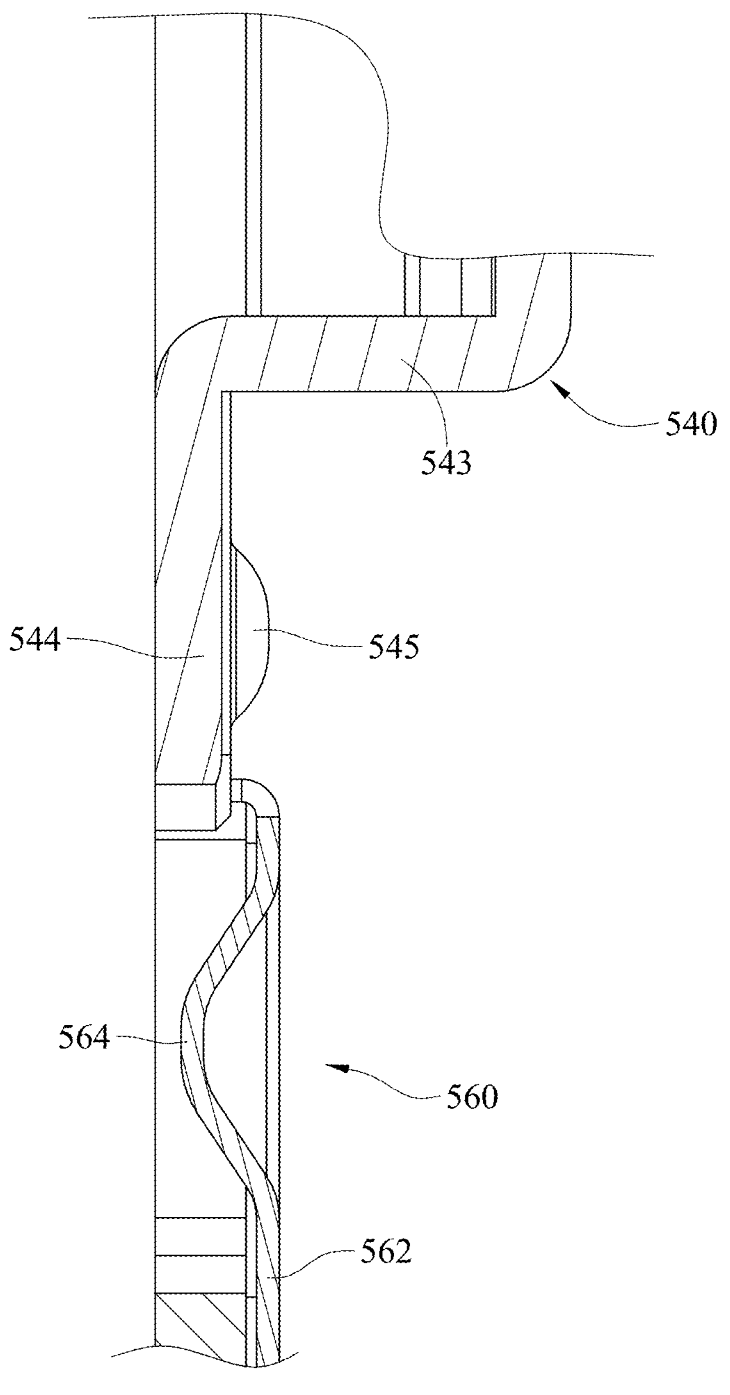
Figure 6:
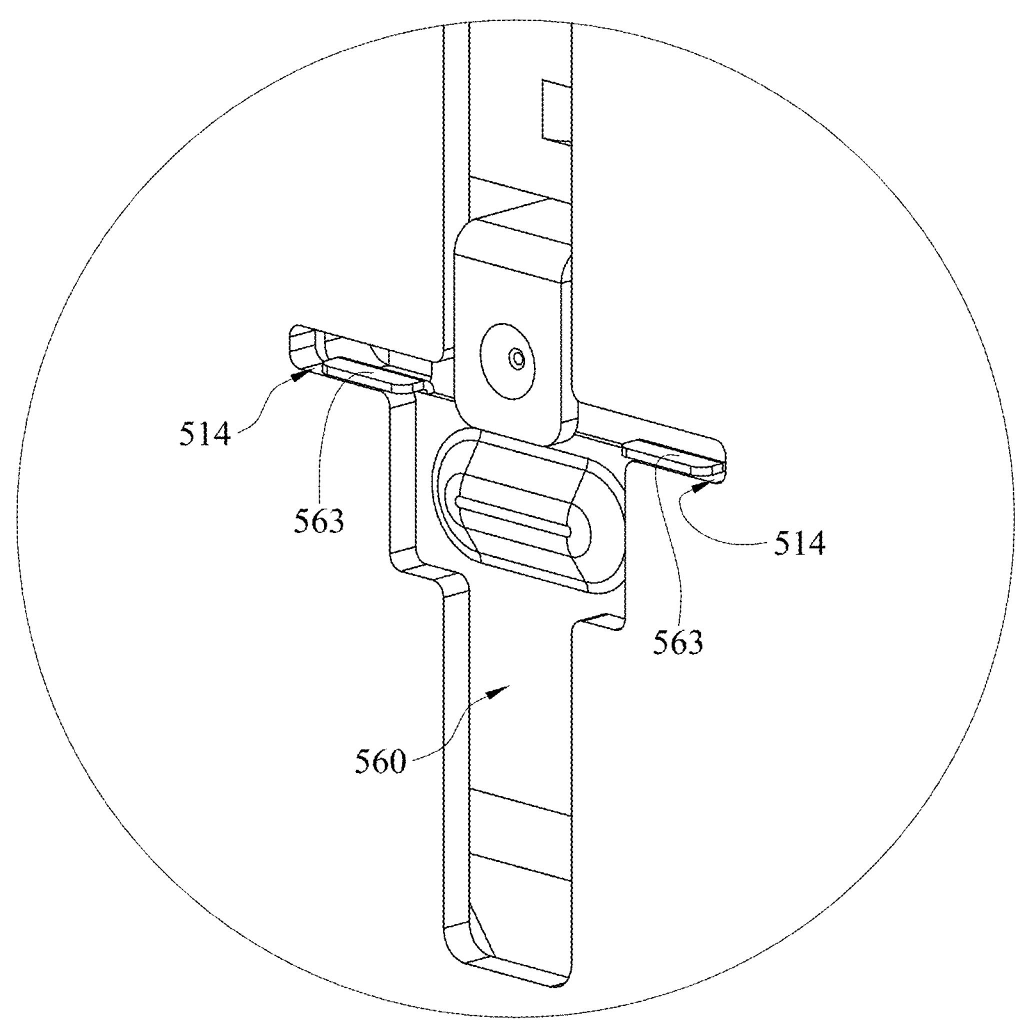

Please refer to FIGS. 4 to 10. FIGS. 4-10 show a mounting process of the expansion assembly 400 of the server 10 in FIG. 1. First, please refer to FIGS. 4 to 6. In FIGS. 4 to 6, the expansion assembly 400 in FIG. 2 has not been mounted on the housing 100. As shown in FIG. 4, when the expansion assembly 400 in FIG. 2 is not mounted on the housing 100, the mounting bracket 520 protrudes out of a top side 131 of the first side plate 130. That is, a portion of the mounting bracket 520 is located outside the accommodation space 150. Moreover, at least a portion of the first pushed portion 542 is located farther away from the top side 131 than the mounting bracket 520. As shown in FIG. 5, when the expansion assembly 400 in FIG. 2 is not mounted on the housing 100, the pushing protrusion 545 of the pushed bracket 540 is spaced apart from the pushed protrusion 564 of the elastic fastener 560. As shown in FIGS. 4 and 6, when the expansion assembly 400 in FIG. 2 is not mounted on the housing 100, the two second engagement structures 563 of the elastic fastener 560 are respectively engaged with the two first engagement structures 514, so as to prevent the mounting bracket 520 from sliding relative to the fixed bracket 510.

Figure 7:
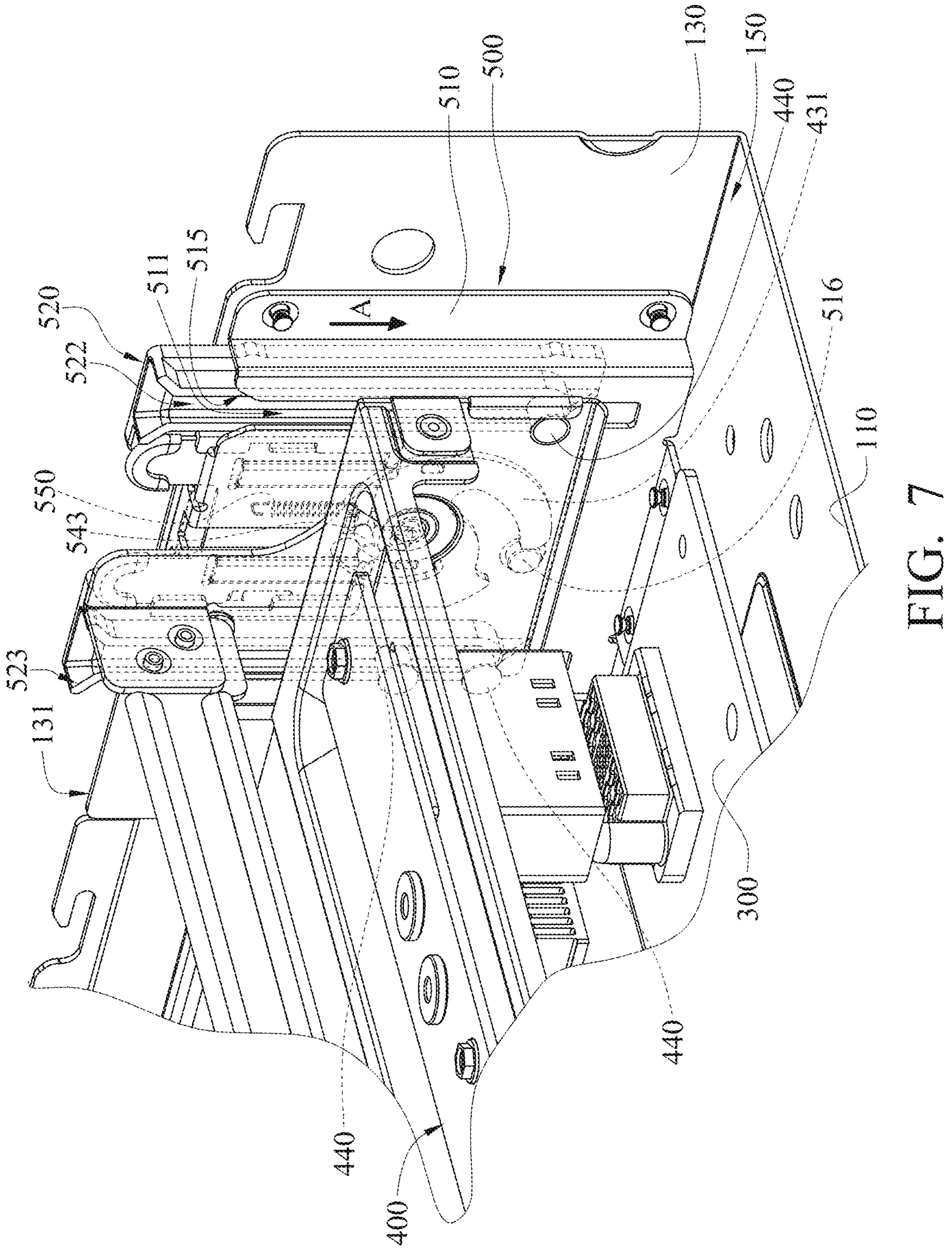
Figure 8:
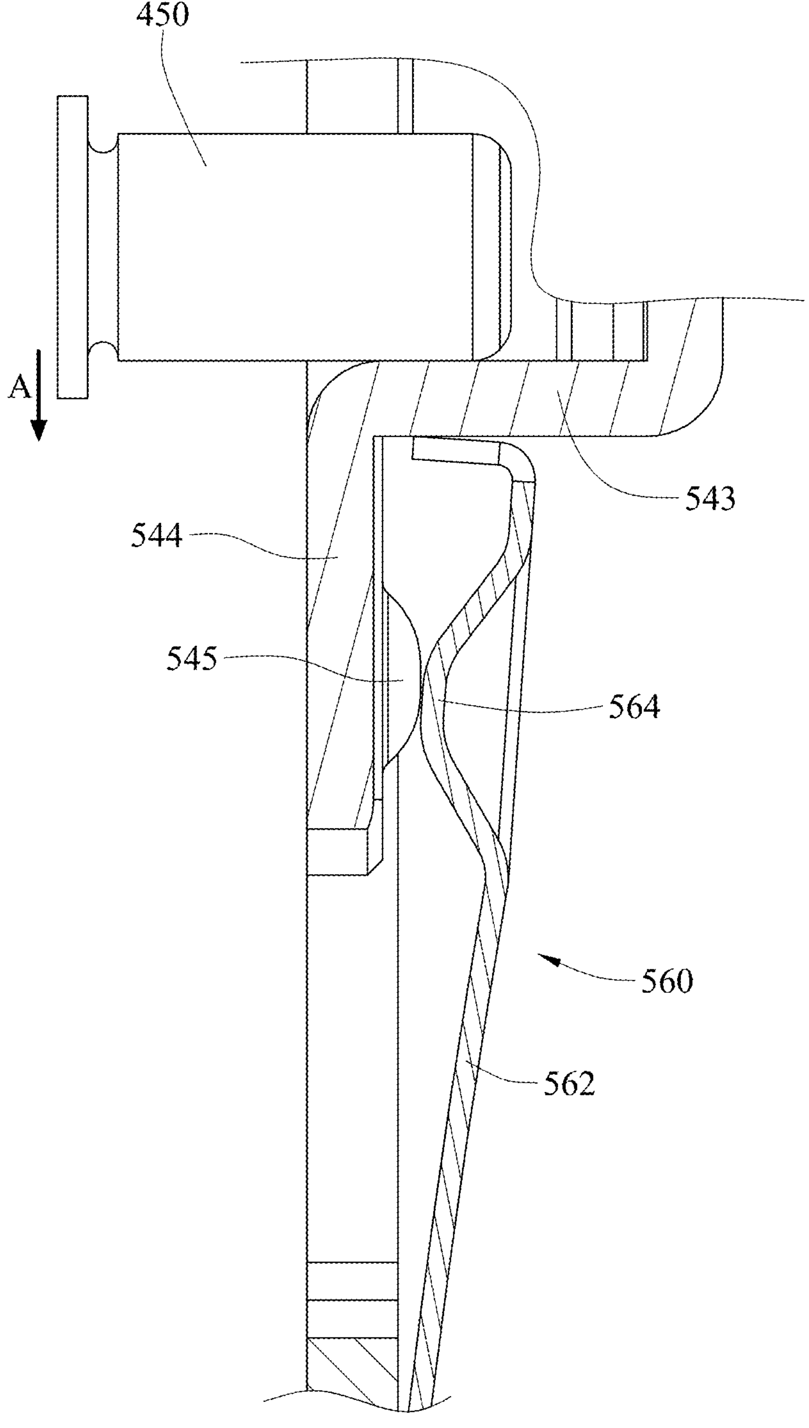
Figure 9:
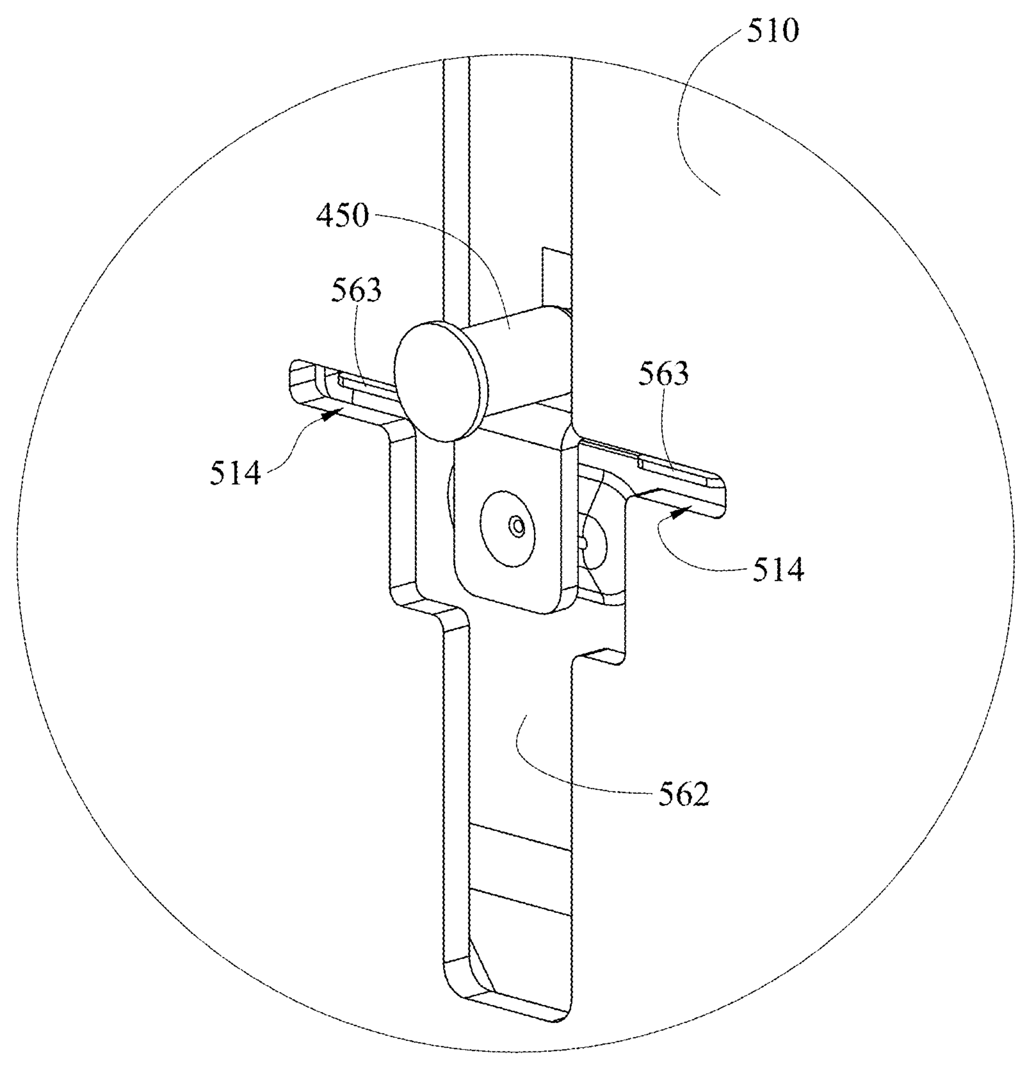

Next, please refer to FIGS. 7 to 9. In FIGS. 7 to 9, the expansion assembly 400 releases the mounting assembly 500 by respectively disengaging the two second engagement structures 563 from the two first engagement structures 514. As shown in FIGS. 7 and 8, in order to release the mounting assembly 500 by the expansion assembly 400, the assembling pin 450 of the expansion assembly 400 presses the second pushed portion 543 along an assembling direction A. Accordingly, the pushed bracket 540 slides relative to the mounting bracket 520 along the assembling direction A to move toward the bottom plate 110, and the elastic component 550 stores elastic energy by being compressed. Also, the second guiding structures 440 of the expansion assembly 400 are respectively and smoothly put into the first sliding structures 511 and the first guiding structures 522 via the guiding surfaces 515 and 523. As shown in FIGS. 8 and 9, when the second pushed portion 543 is pushed by the assembling pin 450 of the expansion assembly 400, the pushing protrusion 545 of the pushed bracket 540 pushes the pushed protrusion 564 of the elastic fastener 560 to move the movable end portion 562 away from the protruding portion 544, thereby disengaging the two second engagement structures 563 of the elastic fastener 560 from the two first engagement structures 514. In this way, the mounting assembly 500 is released so that the mounting bracket 520 is enabled to slide relative to the fixed bracket 510.

Figure 10:
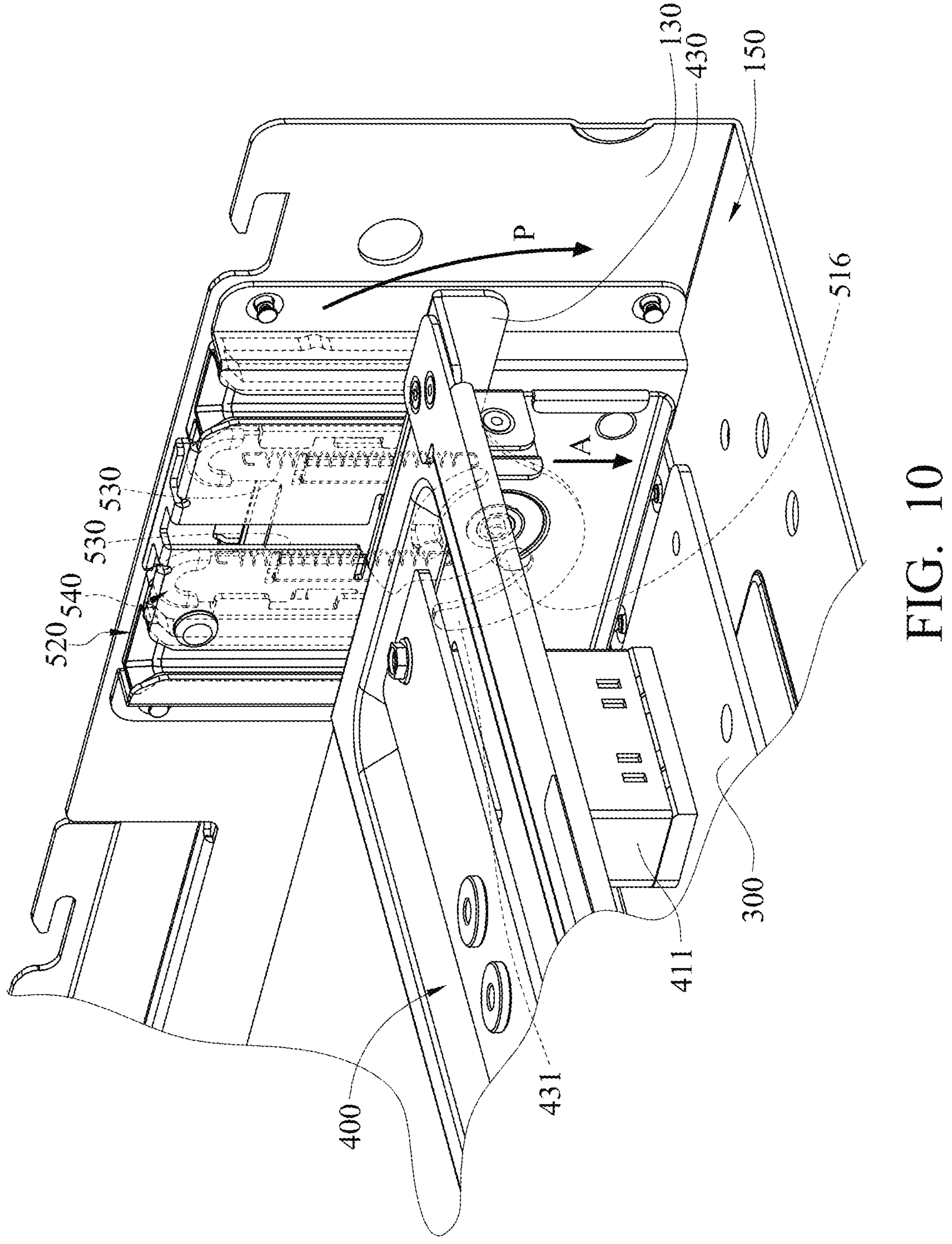

Next, please refer to FIG. 10, the labor-saving handle 430 is pivoted along a pivoting direction P so that the expansion assembly 400, the mounting bracket 520 and the pushed bracket 540 are further moved along the assembling direction A. Thus, the pushed bracket 540 and the mounting bracket 520 are retracted to be located between the top side 131 and the bottom plate 110. That is, the pushed bracket 540 and the mounting bracket 520 are entirely retracted into the accommodation space 150. In this way, the connectors 411 of the expansion assembly 400 is plugged into the circuit board 300 so as to electrically connect the circuit board 300 and the expansion assembly 400. In addition, the elastic component 530 is compressed. Since the mounting pin 516 is pushed by a side of an engagement portion 431 of the labor-saving handle 430, the labor for mounting the expansion assembly 400 to the first side plate 130 via the mounting assembly 500 is saved and the expansion assembly 400 is stably mounted to the first side plate 130 via the mounting assembly 500.

When the expansion assembly 400 is required to be removed from the first side plate 130, another side of the engagement portion 431 of the labor-saving handle 430 may push the mounting pin 516 to save the labor for removing the expansion assembly 400 from the first side plate 130. In addition, the compressed elastic components 530 and 550 release the stored elastic energy during the removal of the expansion assembly 400, so as to facilitate the mounting bracket 520 and the pushed bracket 540 to be respectively moved back to the position in which they protrude out of the top side 131 as shown in FIG. 4.

In order to prevent the assembling of the expansion assembly 400 from being inconvenient due to specific problems such as tilt, the server 10 of this embodiment includes two mounting assemblies 500. However, the disclosure is not limited thereto. In other embodiments, the server may include one mounting assembly.

Figure 11:
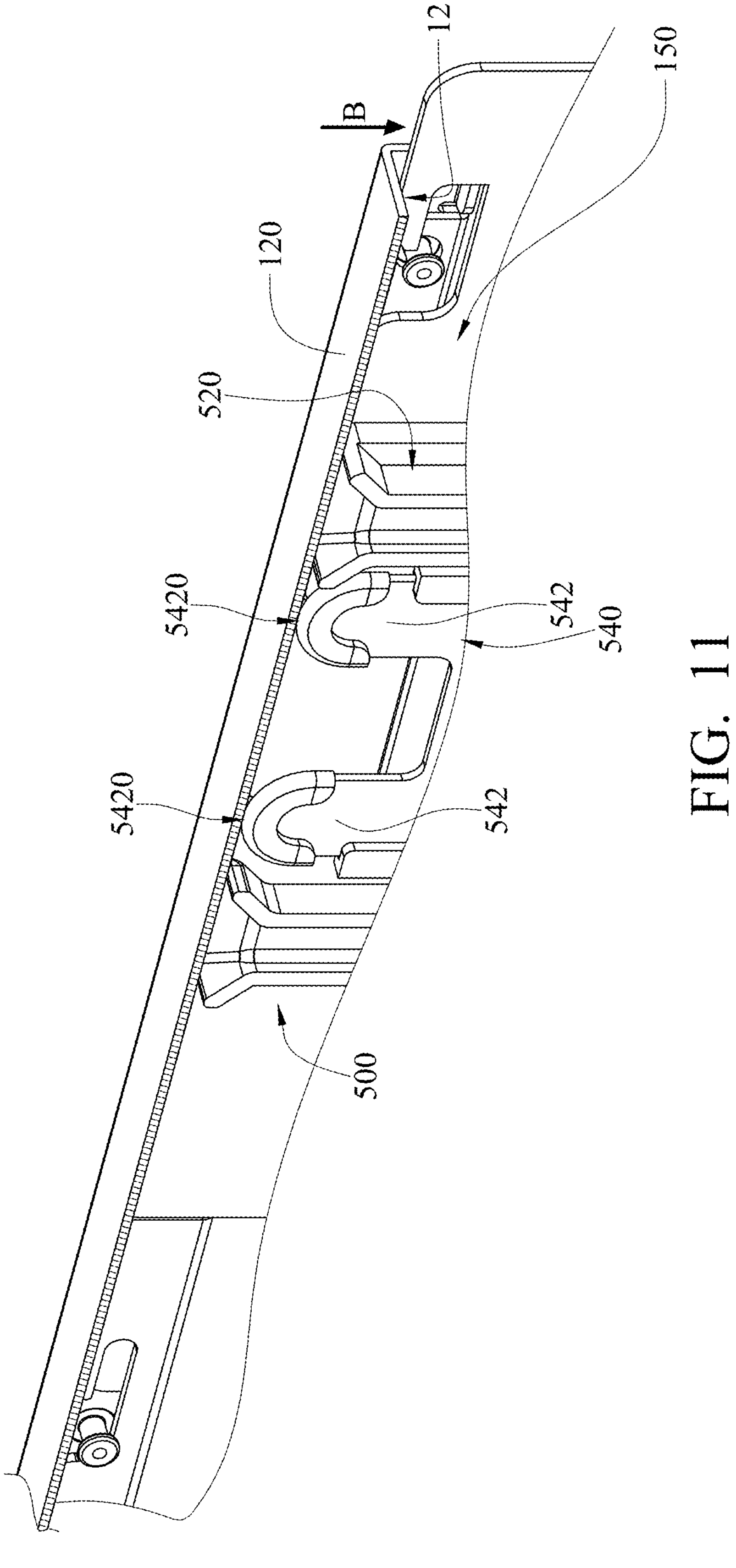
FIGS. 11 and 12 show a mounting process of the top plate of the server in FIG. 1.
Figure 12:
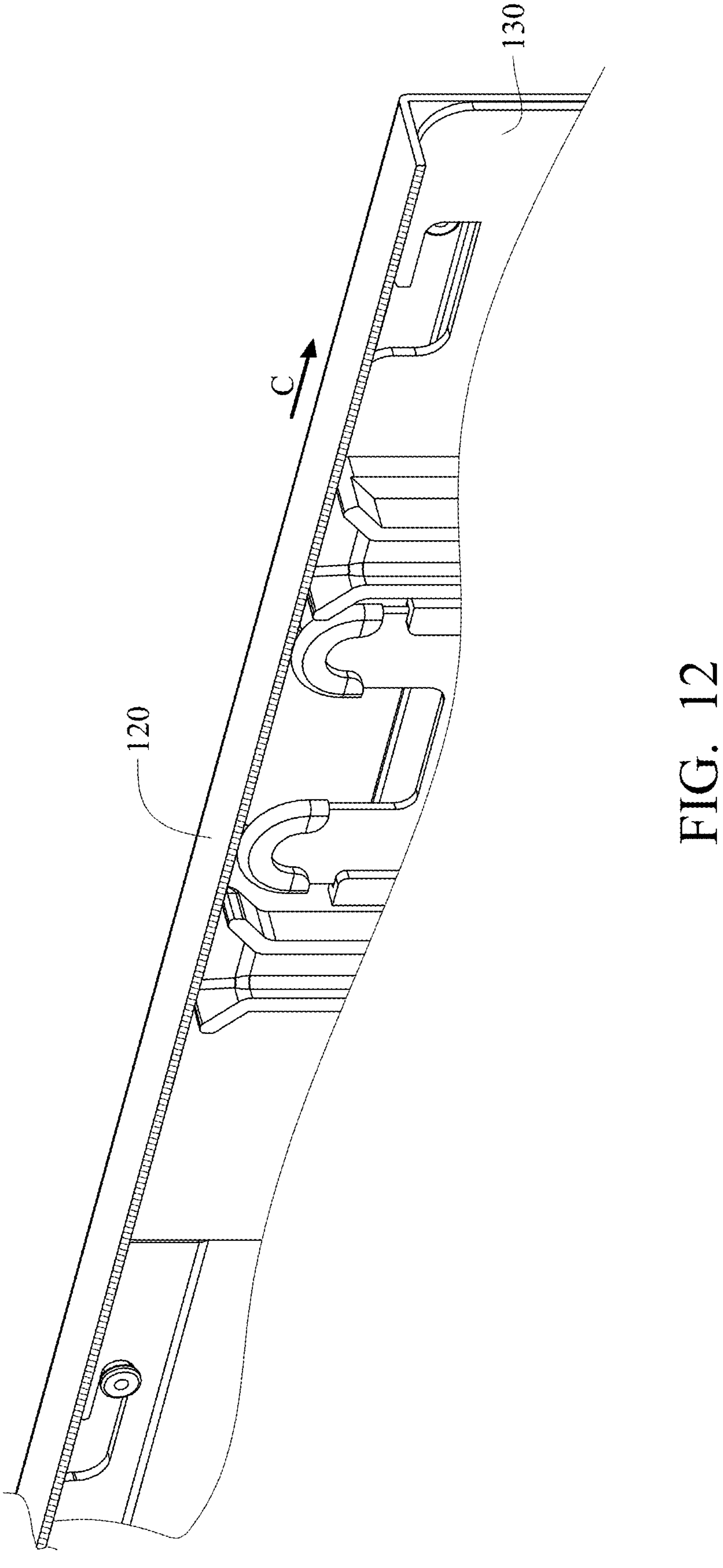

As shown in FIG. 10, when the expansion assembly 400 is mounted on the first side plate 130, the mounting bracket 520 and the pushed bracket 540 are entirely retracted into the accommodation space 150, and thus the installation of the top plate 120 in FIG. 1 is not disturbed thereby. However, even though the expansion assembly 400 is not mounted on the first side plate 130, the installation of the top plate 120 is still not disturbed by the mounting assembly 500 of this disclosure. In detail, please refer to FIGS. 11 and 12. FIGS. 11 and 12 show a mounting process of the top plate 120 of the server 10 in FIG. 1. In order to clearly show the mounting process of the top plate 120, the fixed bracket 510 is omitted from FIGS. 11 and 12. As shown in FIG. 11, when the top plate 120 is moved along an assembling direction B, a bottom surface 121 of the top plate 120 facing the accommodation space 150 smoothly pushes the two first pushed portions 542 via the guiding surfaces 5420 so as to release the mounting assembly 500 by the top plate 120. The release of the mounting assembly 500 can by understood by referring to FIGS. 7 to 9, and thus the relevant descriptions are omitted. Next, the top plate 120 is further moved along the assembling direction B so that the mounting bracket 520 and the pushed bracket 540 are entirely retracted into the accommodation space 150. Next, as shown in FIG. 12, the top plate 120 may be further slid along an engagement direction C perpendicular to the assembling direction B so that the hook portions of the top plate 120 are respectively hooked on the first side plate 130 in the assembling holes.

In this embodiment, the pushed bracket 540 of the mounting assembly 500 includes the first pushed portion 542 and the second pushed portion 543 that are respectively configured to be pressed by the top plate 120 and the expansion assembly 400. Thus, even though the expansion assembly 400 is not mounted on the housing 100, the installation of the top plate 120 is still not disturbed by the mounting assembly 500. Therefore, the flexibility of the configuration of the server 10 is enhanced. However, in other embodiments where the demand for the flexibility of the configuration of the server is low, the mounting assembly may not include the pushed bracket 540.

According to the server chassis and the server disclosed by above embodiments, the mounting bracket is configured for the expansion assembly to be mounted thereon and is movably disposed on the fixed bracket. Thus, the mounting bracket is enabled to be moved to, for example, a position in which it protrudes out of the top side. In this way, during the mount of the expansion assembly, the mounting bracket protruding out of the top side without being blocked by the first side plate is visible. Thus, the expansion assembly is enabled to be mounted on the housing in an accurate and fast manner.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A server chassis configured for an expansion assembly to be mounted thereon, the server chassis comprising:

a housing, comprising a bottom plate, a first side plate and a second side plate, wherein the first side plate and the second side plate are respectively connected to two opposite sides of the bottom plate, and the first side plate has a top side away from the bottom plate; and at least one mounting assembly, each of the mounting assembly comprising:

a fixed bracket, fixed to the first side plate; and a mounting bracket configured for the expansion assembly to be mounted thereon, wherein the mounting bracket movably disposed on the fixed bracket along a height direction of the housing;

wherein each of the at least one mounting assembly further comprises at least one elastic component, and two opposite ends of the at least one elastic component are respectively fixed to the fixed bracket and the mounting bracket.

2. The server chassis according to claim 1, wherein the mounting bracket has at least one first guiding structure, and the at least one first guiding structure selectively protrudes out of the top side and is configured for at least one second guiding structure of the expansion assembly to be mounted thereon.

3. The server chassis according to claim 2, wherein the housing further comprises a top plate disposed on the first side plate and the second side plate, each of the at least one mounting assembly further comprises a pushed bracket, the pushed bracket is movably disposed on the mounting bracket, and the pushed bracket comprises a body portion, at least one first pushed portion and a second pushed portion, the at least one first pushed portion protrudes from a side of the body portion away from the bottom plate and is configured to be pressed by the top plate, and the second pushed portion protrudes from a side of the body portion away from the first side plate and is configured to be pressed by an assembling pin of the expansion assembly.

4. The server chassis according to claim 3, wherein each of the at least one mounting assembly further comprises an elastic fastener, the fixed bracket has at least one first engagement structure, the elastic fastener comprises a fixed end portion, a movable end portion and at least one second engagement structure, the fixed end portion is opposite to the movable end portion, the fixed end portion is fixed to the mounting bracket, and the at least one second engagement structure is located on the movable end portion and detachably engaged with the at least one first engagement structure.

5. The server chassis according to claim 4, wherein each of the at least one mounting assembly further comprises an elastic component, and two opposite ends of the elastic component are respectively fixed to the body portion of the pushed bracket and the mounting bracket.

6. The server chassis according to claim 4, wherein the pushed bracket further comprises a protruding portion and a pushing protrusion, the protruding portion is connected to a side of the second pushed portion away from the body portion, the pushing protrusion protrudes from a side of the protruding portion close to the first side plate, the elastic fastener further comprises a pushed protrusion, the movable end portion is located between the fixed bracket and the first side plate, the pushed protrusion and the at least one second engagement structure are located on a side of the movable end portion away from the first side plate and are spaced apart from each other.

7. The server chassis according to claim 3, wherein each of the at least one first pushed portion has a guiding surface facing away from the body portion and being in a rounded shape.

8. The server chassis according to claim 3, wherein the at least one first pushed part comprises two first pushed portions, and the two first pushed portions protrude from a side of the body portion away from the bottom plate and spaced apart from each other.

9. The server chassis according to claim 2, wherein the at least one first guiding structure and the at least one second guiding structure are respectively a guiding groove and a guiding pin, and there is a plurality of guiding surfaces on a side of the mounting bracket away from the bottom plate.

10. A server, comprising:

a housing, comprising a bottom plate, a first side plate and a second side plate together forming an accommodation space, wherein the first side plate and the second side plate are respectively connected to two opposite sides of the bottom plate, and the first side plate has a top side;

a substrate assembly, disposed in the accommodation space; an expansion assembly, comprising an assembling bracket and a circuit board assembly, wherein the circuit board assembly is disposed on the assembling bracket and electrically connected to the substrate assembly; and at least one mounting assembly, each of the mounting assembly comprising: a fixed bracket, fixed to the first side plate; and a mounting bracket configured for the expansion assembly to be mounted thereon, wherein the mounting bracket movably disposed on the fixed bracket along a height direction of the housing;

wherein each of the at least one mounting assembly further comprises at least one elastic component, and two opposite ends of the at least one elastic component are respectively fixed to the fixed bracket and the mounting bracket.

11. The server according to claim 10, wherein the mounting bracket has at least one first guiding structure, the expansion assembly has at least one second guiding structure, the at least one second guiding structure is located on the assembling bracket, and the at least one first guiding structure selectively protrudes out of the top side and is configured for the at least one second guiding structure of the expansion assembly to be mounted thereon.

12. The server according to claim 11, wherein the housing further comprises a top plate disposed on the first side plate and the second side plate, each of the at least one mounting assembly further comprises a pushed bracket, the pushed bracket comprises a body portion, at least one first pushed portion and a second pushed portion, the body portion is movably disposed on the mounting bracket, the at least one first pushed portion protrudes from a side of the body portion away from the bottom plate and is configured to be pressed by the top plate, and the second pushed portion protrudes from a side of the body portion away from the first side plate and is configured to be pressed by an assembling pin of the expansion assembly.

13. The server according to claim 12, wherein each of the at least one mounting assembly further comprises an elastic fastener, the fixed bracket has at least one first engagement structure, the elastic fastener comprises a fixed end portion, a movable end portion and at least one second engagement structure, the fixed end portion is opposite to the movable end portion, the fixed end portion is fixed to the mounting bracket, and the at least one second engagement structure is located on the movable end portion and detachably engaged with the at least one first engagement structure.

14. The server according to claim 13, wherein each of the at least one mounting assembly further comprises an elastic component, and two opposite ends of the elastic component are respectively fixed to the body portion of the pushed bracket and the mounting bracket.

15. The server according to claim 13, wherein the pushed bracket further comprises a protruding portion and a pushing protrusion, the protruding portion is connected to a side of the second pushed portion away from the body portion, the pushing protrusion protrudes from a side of the protruding portion close to the first side plate, the elastic fastener further comprises a pushed protrusion, the movable end portion is located between the fixed bracket and the first side plate, the pushed protrusion and the at least one second engagement structure are located on a side of the movable end portion away from the first side plate and are spaced apart from each other.

16. The server according to claim 12, wherein each of the at least one first pushed portion has a guiding surface facing away from the body portion and being in a rounded shape.

17. The server according to claim 12, wherein the at least one first pushed part comprises two first pushed portions, and the two first pushed portions protrude from a side of the body portion away from the bottom plate and spaced apart from each other.

18. The server according to claim 11, wherein the at least one first guiding structure and the at least one second guiding structure are respectively a guiding groove and a guiding pin, and there is a plurality of guiding surfaces on a side of the mounting bracket away from the bottom plate.

* * * * *